(12) United States Patent
Andreev et al.

(10) Patent No.: US 6,412,102 B1
(45) Date of Patent: Jun. 25, 2002

(54) WIRE ROUTING OPTIMIZATION

(75) Inventors: Alexander Andreev; Ivan Pavisic, both of San Jose; Pedja Raspopovic, Cupertino, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/120,617

(22) Filed: Jul. 22, 1998

(51) Int. Cl.[7] .............................................. G06F 17/50
(52) U.S. Cl. ............................. 716/12; 716/2; 716/13
(58) Field of Search ............................... 716/12, 13, 2

(56) References Cited

U.S. PATENT DOCUMENTS

| | | | | |
|---|---|---|---|---|
| 4,612,618 A | * | 9/1986 | Pryor et al. .................. | 364/490 |
| 4,831,725 A | * | 5/1989 | Dunham et al. ............... | 29/847 |
| 5,420,800 A | * | 5/1995 | Fukui ......................... | 364/491 |
| 5,495,419 A | | 2/1996 | Rostoker et al. ............. | 364/468 |
| 5,566,078 A | * | 10/1996 | Ding et al. .................. | 364/490 |
| 5,583,788 A | * | 12/1996 | Kuribayashi ................ | 364/490 |
| 5,699,265 A | * | 12/1997 | Scepanovic et al. ......... | 364/491 |
| 5,798,936 A | * | 8/1998 | Cheng ........................ | 364/489 |
| 5,838,585 A | * | 11/1998 | Scepanovic et al. ......... | 364/491 |
| 5,856,927 A | * | 1/1999 | Greidinger et al. .......... | 364/491 |
| 5,872,718 A | * | 2/1999 | Scepanovic et al. ......... | 364/491 |
| 5,909,376 A | * | 6/1999 | Scepanovic et al. ......... | 364/491 |
| 5,963,455 A | * | 10/1999 | Scepanovic et al. ......... | 364/491 |
| 6,067,409 A | * | 5/2000 | Scepanovic et al. ... | 395/500.09 |
| 6,068,662 A | * | 5/2000 | Scepanovic et al. ........... | 716/2 |

OTHER PUBLICATIONS

T. Koide et al., A Timing–Driven Global Routing Algorithm with Pin Assignment, Block Reshaping, and Positioning for Building Block Layout, Proceedings of 1998 Design Automation Conference, pp. 577–583, Jan. 1998.*

* cited by examiner

Primary Examiner—Matthew Smith
Assistant Examiner—A. M. Thompson
(74) Attorney, Agent, or Firm—Mitchell Silberberg & Knupp LLP

(57) ABSTRACT

The invention is directed to optimization of an initial routing that connects nets on a surface, each of the nets including plural interconnected net pins. The surface is divided into a set of areas, and a boundary pin is defined at each point on a boundary of one of the areas where the boundary of the one of the areas intersects a net. Routing optimization is then performed in at least one of the areas, the routing optimization optimizing the routing among the net pins and the boundary pins within the at least one of the areas. The invention is also directed to optimization of an initial routing that connects nets on a surface, each of the nets including plural interconnected net pins. The surface is divided into a first set of pre-defined areas, and routing optimization is performed independently in each of the pre-defined areas in the first set. The surface is divided into a second set of pre-defined areas, and routing optimization is performed independently in each of the pre-defined areas in the second set. It is a feature of this aspect of the invention that each of plural pre-defined areas in the first set overlaps at least two pre-defined areas in the second set, and each of plural pre-defined areas in the second set overlaps at least two pre-defined areas in the first set.

33 Claims, 5 Drawing Sheets

WIRE ROUTING OPTIMIZATION

BACKGROUND OF THE INVENTION

1. Field of the Invention

The present invention concerns wire routing optimization, and particularly relates to wire routing optimization during integrated circuit (IC) design.

2. Description of the Related Art

To perform integrated circuit design in an efficient and relatively quick manner, the design process typically is implemented as a series of discrete steps. The starting point for the physical design step typically is a particular type of circuit description, called a "netlist". In general, a netlist specifies a number of standard circuit elements, called "cells", together with interconnections between the cells. More specifically, the netlist specifies interconnections between particular "pins" on the various cells. Each connected group of pins is referred to as a "net". Based on the input netlist, the physical design step generates information which can be used to fabricate an integrated circuit to implement the specified circuit description.

One sub-step of physical design involves laying out (or placing) the cells on the surface of the integrated circuit chip (or die). After the cells have been so placed, wires are routed between pins on the cells as specified by the input netlist. It should be noted that wire routing refers to the mapping out of the intended paths for each connection, with the actual wires being formed during the fabrication step.

In particular, wires ordinarily are routed on one or more metal layers which are formed on top of a semiconductor substrate of the IC die. Currently, a typical IC die includes 2 to 4 metal layers. However, even more metal layers are contemplated. The routing step ordinarily includes a global routing step and a detailed routing step.

Global routing specifies rough routing paths through different regions of the routing space, such as by using a coarse routing grid. Detailed routing then completes the point-to-point connections between the pins based on the global routing information.

After an initial global routing has been completed, it is typically necessary or desirable to perform routing optimization, such as to re-route wires routed in overly congested regions. One example of such routing optimization is described in U.S. patent application Ser. No. 09/062, 246 filed Apr. 17, 1998, titled "Method and Apparatus for Coarse Global Routing", now U.S. Pat. No. 6,260,183. Application Ser. No. 09/062,246(the '246 Application) is hereby incorporated herein by reference, as though set forth herein in full.

The method for routing optimization described in the '246 Application is described as follows. For each net, two quotients are calculated: The length of net's bounding box divided by the length of the design, and the width of the net's bounding box divided by the width of the design. The larger of the two is termed the net's characteristic. This roughly suggests how large a part of design needs to be in order to contain the net's bounding box. The nets are then ordered in descending order according to this characteristic. The nets with a characteristic larger than ¼ are routed sequentially. Then, the design is split into four parts, and different processors are given different parts and instructed to route only the nets that are completely contained in the corresponding parts and have a characteristic that is larger than ⅛. Next, the parts are shifted to the right by a quarter of the design's length and the same operation is followed. The parts are then shifted from their original positions down by a quarter and the routing procedure is repeated. The parts are then shifted from their original positions both down and to the right by a quarter and the routing procedure is repeated. This way all nets with characteristics larger than ⅛ will be routed. Next the design is split into twice smaller parts, the nets of characteristic larger than 1/16 are considered and the shifting process is repeated, moving the parts ⅛ instead of ¼. At this point, more processors can be included to speed up the routing process. This process is repeated a few times using smaller and smaller parts, and once all the processors are kept busy, all the remaining nets are re-routed.

Thus, in the foregoing routing optimization technique, the largest nets are processed first, and then the chip is divided into progressively smaller parts to accommodate nets of various sizes, with each part being assigned to a different processor. This technique therefore permits re-routing using parallel processing. However, applicants have discovered that the foregoing technique has certain disadvantages which can limit the speed of routing optimization. First, when using the above technique, each net is re-routed as a whole. As a result, a significant amount of processing time often is required in order to re-route very large nets according to this technique. In addition, maximum use of parallel processing can only be attained with the above technique when the lower levels of chip area division are reached.

FIG. 1 illustrates these problems with the foregoing approach. Specifically, FIG. 1 illustrates an integrated circuit chip 1 upon which a net 5 is initially routed. Net 5 consists of pins 7 and interconnection segments 9 between the pins. As shown in FIG. 1, net 5 is larger than a single quadrant of the integrated circuit chip. Accordingly, net 5 is processed in its entirety in the first stage of the foregoing technique, before the chip is divided into smaller parts. As a result, the advantages of parallel processing are not realized when re-routing net 5. Moreover, due to the size of net 5, re-routing it very likely will require a large amount of processing time.

Therefore, a faster method of re-routing nets is desired.

SUMMARY OF THE INVENTION

The present invention addresses this need by dividing a surface, such as a surface of an IC chip, into a set of areas and defining boundary pins where nets intersect the boundary areas.

Thus, according to one aspect, the invention is directed to optimization of an initial routing that connects nets on a surface, each of the nets including plural interconnected net pins. The surface is divided into a set of areas, and a boundary pin is defined at each point on a boundary of one of the areas where the boundary of the one of the areas intersects a net. Routing optimization is then performed in at least one of the areas, the routing optimization optimizing the routing among the net pins and the boundary pins within the at least one of the areas.

By virtue of the foregoing arrangement, large nets frequently can be re-routed in smaller portions, which can have the effect of decreasing the amount of time required for routing optimization processing. In addition, use of boundary pins as set forth above generally will permit each area to be processed independently of the others, so as to allow a different processor to process each different area.

The present invention also addresses the foregoing need by independently performing routing optimization in pre-defined areas in a first set, and also independently performing routing optimization in pre-defined areas in a second set, where each of certain pre-defined areas in the first set overlap at least two pre-defined areas in the second set and each of certain pre-defined areas in the second se t overlap at least two pre-defined areas in the first set.

Thus, according to a further aspect, the invention is directed to optimization of an initial routing t hat connects nets on a surface, each of the nets including plural interconnected net pins. The surface is divided into a first set of pre-defined areas, and routing optimization is performed independently in each of the pre-defined areas in the first set. The surface is divided into a second set of pre-defined areas, and routing optimization is performed independently in each of the pre-defined areas in the second set. It is a feature of this aspect of the invention that each of plural pre-defined areas in the first set overlaps at least two pre-defined areas in the second set, and each of plural pre-defined areas in the second set overlaps at least two pre-defined areas in the first set.

By virtue of the foregoing arrangement, the present invention can frequently provide adequate routing optimization even in the presence of large nets, and even though routing optimization is performed independently in the pre-defined areas, such as by using parallel processing. In particular, the foregoing arrangement can generally permit re-routing of connections within a larger area than the pre-defined areas in which routing optimization is performed. Moreover, in more particularized aspects, the foregoing arrangement can often permit a flexible tradeoff between speed and quality of results, by merely increasing or decreasing a number of iterations performed.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

Figure 1:
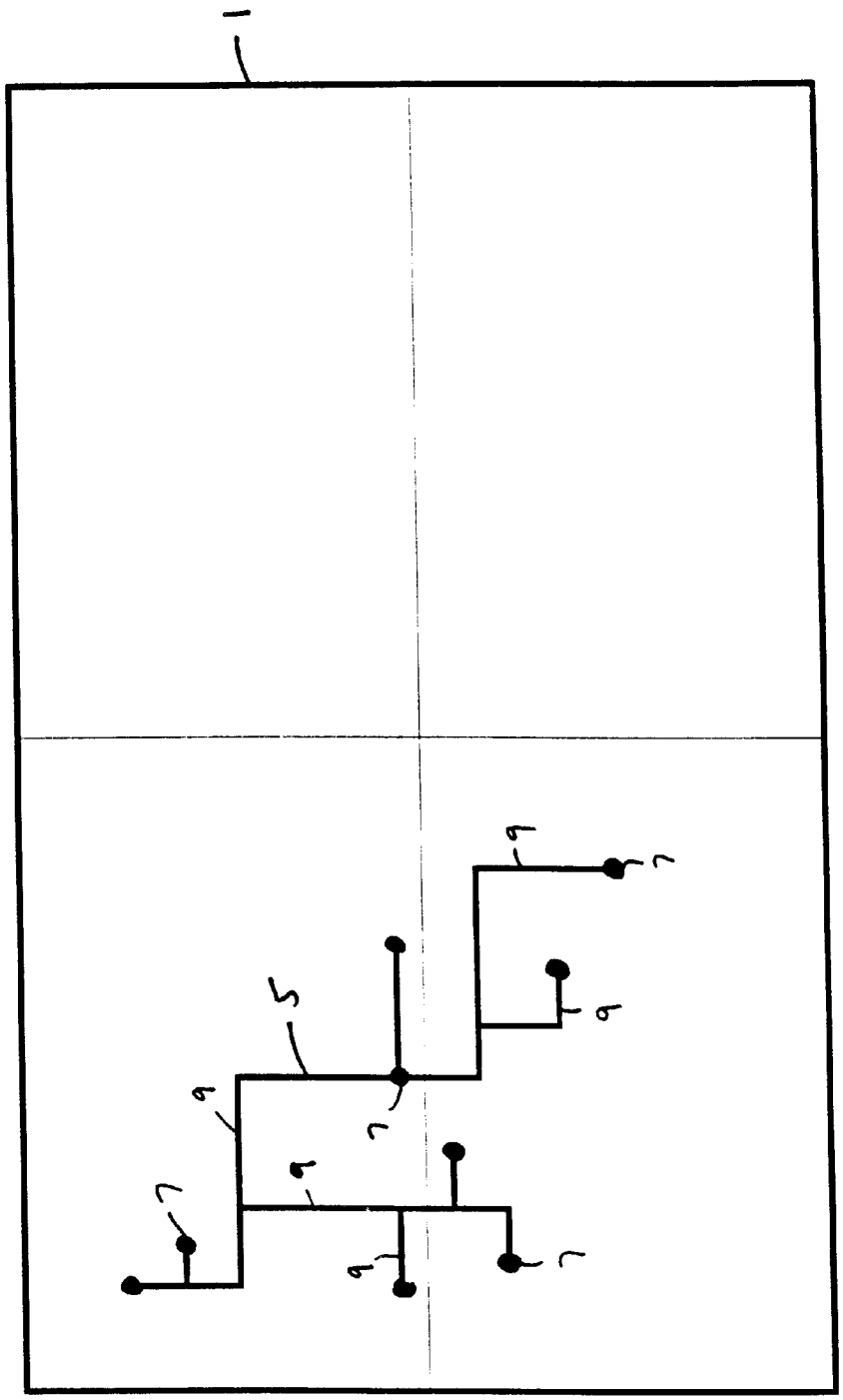
FIG. 1 illustrates an example of a large net to be re-routed.
Figure 2:
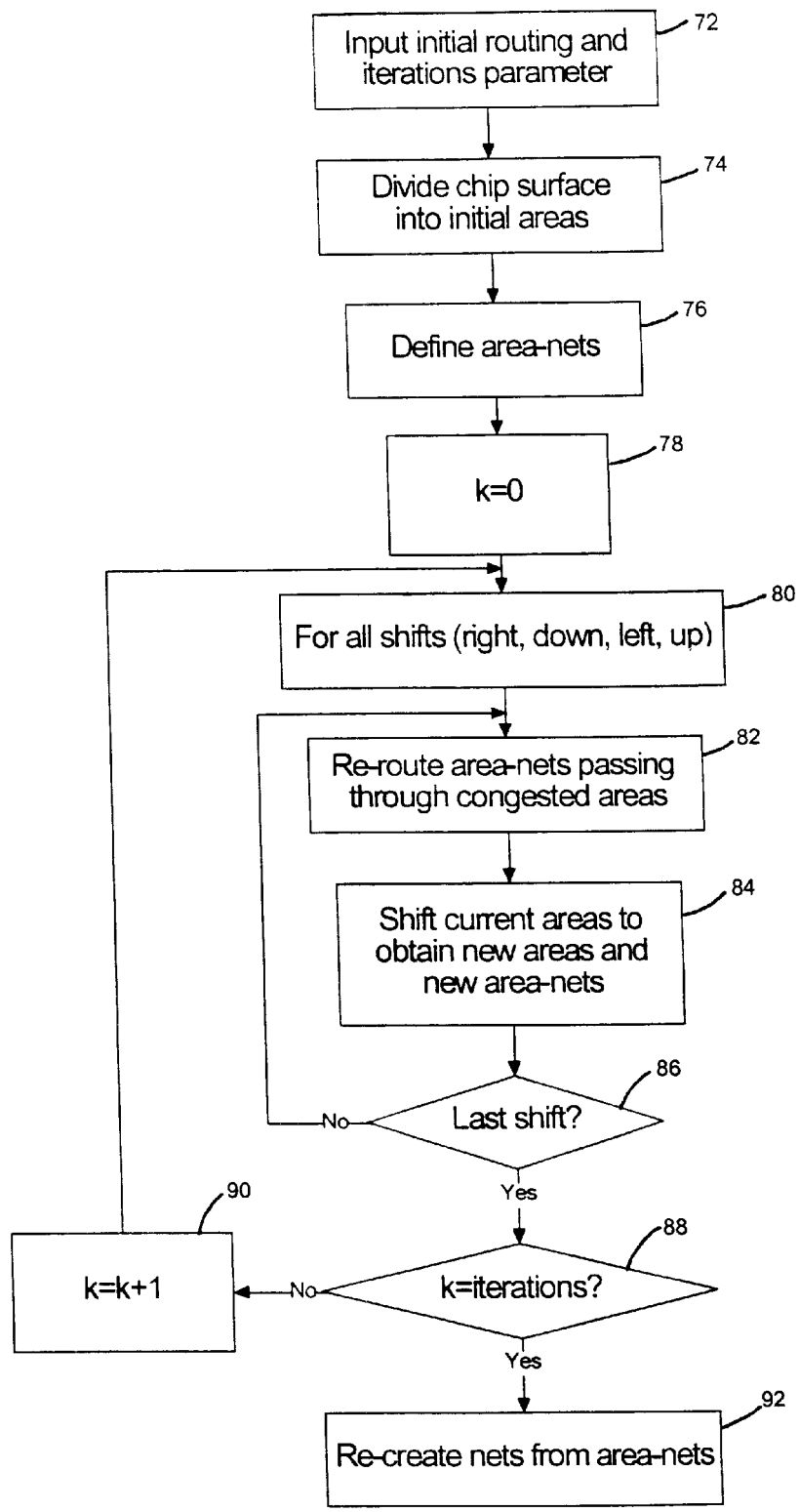
FIG. 2 is a flow diagram for explaining routing optimization according to a preferred embodiment of the invention.

FIG. 2 is a flow diagram for explaining routing optimization according a preferred embodiment of the invention. Specifically, the process illustrated in FIG. 2 concerns optimization of an initial global routing. However, it should be understood that the present invention also is applicable to optimization of detailed routing and to any other situation where an initial routing is provided. Briefly according to FIG. 2, the initial routing is input, together with an iteration parameter; initial areas are specified; area-nets are defined; a counter k is initialized; for each shift of several different shifts, the area-nets are re-routed and the previous areas are shifted to obtain new area-nets; and finally, after all iterations of k have been completed, the nets are re-created from the area-nets.

In more detail, in step 72 the initial routing description and an iteration parameter are input. Preferably, the initial routing description is a global routing description which was generated using a maze routing technique, such as the maze routing technique described in the '246 Application. However, the present invention is not limited to such an initial routing, and initial global routing generated by any other technique, such as a Steiner tree based technique, instead be used. Similarly, the invention may also apply to an initial detailed routing. The input iteration parameter is described in more detail below.

In step 74, a surface area of the integrated circuit chip is divided into initial areas. In the preferred embodiment, the initial areas are all rectangular-shaped, contiguous and identical in dimensions. Thus, in the preferred embodiment, the initial areas can be specified by superimposing a regular rectangular grid over the desired surface area of the chip. Preferably, the characteristic size (e.g., with respect to a rectangle, the length and the width) of each of the areas is chosen to be approximately twice the average expected net size in each corresponding dimension.

Figure 3A:
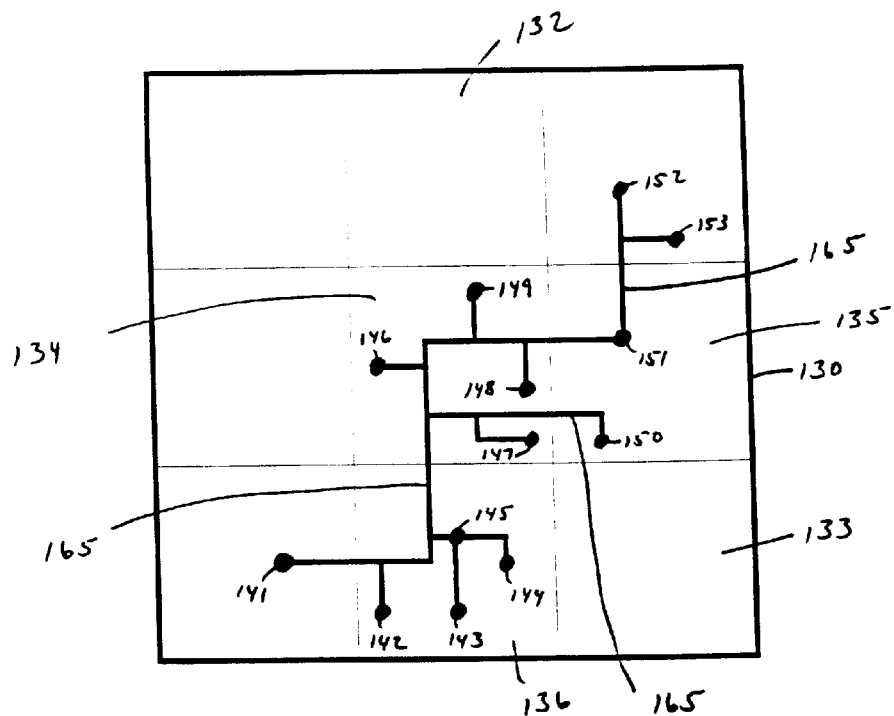
FIGS. 3A and 3B illustrate division of a portion of an integrated circuit chip and generation of area-nets according to the invention, for a particular large net.

Division of a portion of the chip in this manner is illustrated in FIG. 3A. Specifically, in FIG. 3A, chip area portion 130 is divided into 9 rectangular areas, such as areas 132 to 136. Located in portion 130 of the IC chip is a net which includes net pins 141 to 153, as well as wire or trace segments 165 that interconnect the net pins. It should be noted that while rectangular-shaped areas are preferred, any other shapes may instead be used.

Referring again to FIG. 2, in step 76 an area-net is defined within each of the areas for each net that is at least partially located in that area. An area-net is generally described as the portion of a net lying in the subject area, together with any boundary pins (described below). As an intermediate step in defining an area-net, boundary points are located where the net intersects boundaries of the areas. Each of these boundary points is then defined as a boundary pin for each area whose boundary the boundary point lies on. The net pins and boundary pins within a given area for a particular net, together with the interconnections between such boundary pins and net pins, constitute an area-net.

Figure 3B:
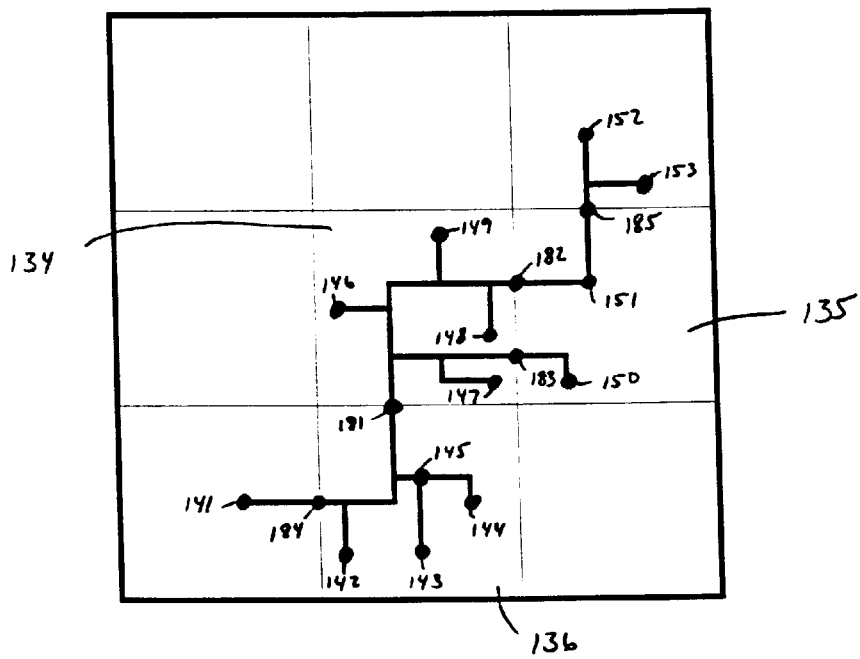

An example of the application of step 76 is shown in FIG. 3B. Specifically, FIG. 3B illustrates the chip portion and the net illustrated in FIG. 3A, and shows how some of the area-nets corresponding to that net are defined. Initially, points 181 to 185 are identified where the net intersects the area boundaries. Because boundary point 181 lies on the boundary between area 134 and area 136, a boundary pin 181 is included in each of areas 134 and 136. Similarly, because boundary points 182 and 183 are located on the boundary between areas 134 and 135, boundary pins 182 and 183 are included in each of such areas. Therefore, the area-net corresponding to the depicted net for area 134 includes net pins 146 to 149, boundary pins 181 to 183, and all the interconnections between those net pins and boundary pins. It is noted that all such interconnections also lie within area 134. In a similar manner, the area-net corresponding to the illustrated net for area 136 includes net pins 142 to 145, boundary pins 181 and 184, and the interconnections between these net pins and boundary pins. Once again, it is noted that all such interconnections lie within area 136.

Returning again to FIG. 2, in step 78 a counter k is initialized to 0, beginning a loop which will be repeated a number of times specified by the iteration parameter input in step 72.

In step 80, a loop is begun which will repeat for each of a right shift, down shift, left shift and up shift, as such shifts are described below.

In step 82, the area-nets in each area are re-routed. In particular, in the preferred embodiment, those portions of the area-nets passing through overly congested areas are re-routed. Preferably, the re-routing in this step is performed using a technique similar to the technique used to generate the initial routing. Thus, in the preferred embodiment, re-routing is performed using a maze routing technique, such as the technique described in the '246 Application. However, other types of re-routing may instead be used. Preferably, if a connection needs to be re-routed, but can not be adequately re-routed within the subject area, the connection is re-routed to a position nearer to the edge of the subject area. This will tend to facilitate further movement of the problem connections in later steps of the processing.

It is also preferable that each area is processed in this step independently of the processing performed in other areas. Accordingly, in the preferred embodiment, each area can be re-routed at the same time using a different processor.

During re-routing of the area-nets, all of the pins in a given area remain fixed while the interconnections are re-routed within that area. It is noted that use of boundary pins in the manner described above insures that the nets can be reconstructed upon completion of such parallel re-routing processing.

In step 84, the boundaries of the current areas are shifted so as to obtain new areas. In the preferred embodiment, as indicated above, the current shift depends upon which pass of the loop begun in step 80 the process is currently performing. Thus, in the first pass all of the current boundaries are shifted to the right; in the second pass, all of the current boundaries are shifted down; in the third pass, all of the current boundaries are shifted to the left; and in the last pass all of the current boundaries are shifted up. Preferably, the amount of each shift is equal to approximately one-half of the dimension of each area in the shifting direction. More preferably, the amount of the shift is equal to exactly one-half of this dimension. Accordingly, in the preferred embodiment, when the boundaries are shifted to the right (i.e., in the x direction), the shift amount is equal to one-half of the x dimension of one of the areas.

As noted above, in the preferred embodiment the new areas are generated by shifting the boundaries of the previous areas. However, that particular method of generating new areas is not essential and various. other methods of generating a different area pattern may instead be used. In any event, it is preferable that each new area overlaps at least two of the previous areas and each previous area overlaps at least two of the new areas. As will be seen below, this will help ensure that congested areas near boundaries also will be appropriately re-routed.

Once the new areas have been located, new area-nets also are defined in this step. In order to define the new area-nets in this step, the boundary pins corresponding to the previous areas are first eliminated. Thus, if the net includes a connection routed from net pin A to boundary pin B and another connection routed from boundary pin B to net pin C, the foregoing arrangement is replaced by a single connection from net pin A to net pin C. Thereafter, new boundary pins are identified at the boundary points where the nets intersect the boundaries of the new areas. Then, the new area-net for a given net and a given area is defined as the net pins within that area, the new boundary pins within that area, and all interconnections between such net pins and new boundary pins.

In step 86 it is determined whether the current shift is the last shift (i.e., "up" in the preferred embodiment). If it is not the last shift, then processing proceeds to step 82 to re-route the new area-nets. Otherwise, processing proceeds to step 88.

Figure 4A:
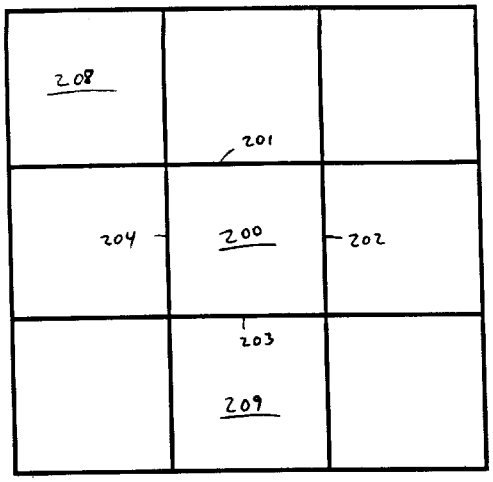
FIGS. 4A to 4D illustrate different sets of areas for use in routing optimization according to a preferred embodiment of the invention.
Figure 4B:
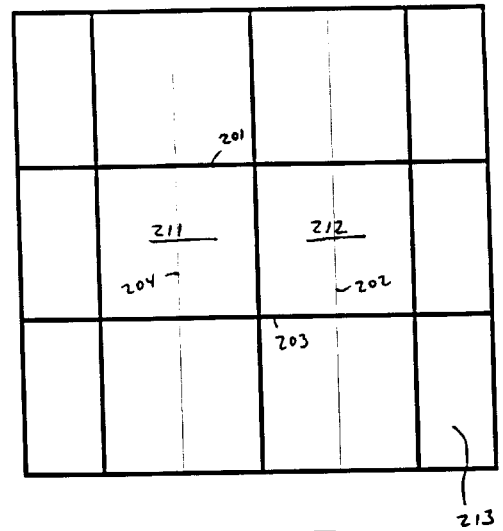

In order to clarify the foregoing process, the area shifting pattern according to the preferred embodiment of the invention will now be described in more detail with reference to FIGS. 4A through 4D. Specifically, FIG. 4A illustrates the initial area pattern for a portion of an integrated circuit chip, in which the subject chip portion is divided into 9 different initial areas. One such initial area is area 200 having boundaries 201, 202, 203 and 204. Other initial areas include areas 208 and 209. According to the preferred embodiment of the invention, each of the areas depicted in FIG. 4A is processed independently so as to re-route the area-nets contained in it. In the first pass of the loop, the areas shown in FIG. 4B are obtained by right shifting the boundaries of the areas shown in FIG. 4A by a distance equal to one-half of the length of one of the areas in the x dimension. Thus, for example, FIG. 4B shows new areas 211 and 212, as well as a portion of new area 213.

For reference purposes, the initial boundaries 201 to 204 of initial area 200 are also shown in FIG. 4B. As can be seen by referring to FIG. 4B, the space previously occupied by area 200 is now occupied by areas 211 and 212. Moreover, boundary 202 of previous area 200 now lies in the middle of area 212 and boundary 204 of previous area 200 now lies in the middle of area 211.

Figure 4D:
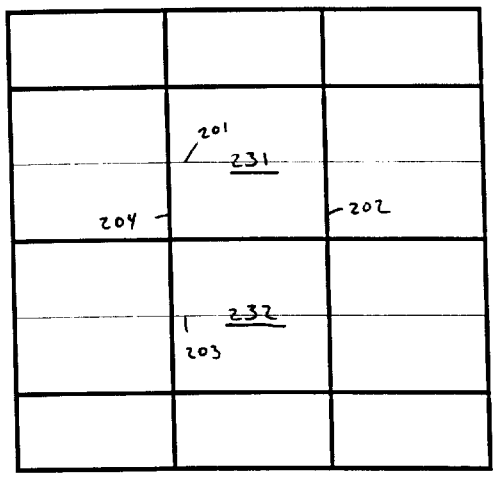
Figure 4C:
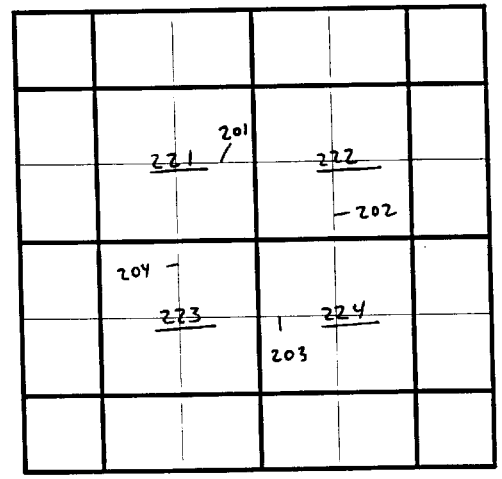

In the second pass, the areas shown in FIG. 4C are generated by shifting the boundaries of the areas shown in FIG. 4B down by a distance equal to one-half the length of an area in the y dimension. As shown in FIG. 4C, the space previously occupied by area 200 is now occupied by four different areas, i.e., areas 221 to 224.

In the third pass, the boundaries of the areas shown in FIG. 4C are shifted left a distance equal to one-half the length of an area in the x dimension, so as to provide the areas shown in FIG. 4D. As shown in FIG. 4D, the space previously occupied by area 200 is now occupied by areas 231 and 232.

Finally, in the fourth pass the boundaries of the areas shown in FIG. 4D are shifted up one-half the length of an area in the y direction, so as to generate the original area pattern shown in FIG. 4A.

By shifting areas in this manner, spaces on the surface the integrated circuit chip are covered by different pre-defined areas. Accordingly, if it is not possible to re-route within a particular initial area, it may be possible to re-route in a new area during a subsequent pass. Specifically, use of different area configurations according to the invention can permit routing to be dispersed over a larger area. Moreover, repeating the pattern a number of times equal to the iterations parameter generally will permit even greater dispersion of congested routing. Thus, even if all congestion still can not be cleared up using immediately adjacent areas, repeating the pattern of different area configurations a sufficient number of times generally will permit enough routing to be dispersed far enough away from the congested areas so as to result in an acceptable solution.

Returning to FIG. 2, in step 88 it is determined whether the current iteration is the last. If not, processing proceeds to step 90 to increment the k counter and then to step 80 to begin the shift pattern for the new iteration. Otherwise, processing proceeds to step 92. It is noted that in the preferred embodiment a pre-defined fixed number .of iterations of the chosen shift pattern is utilized. However, the pattern may instead be repeated until one or more end criteria have-been satisfied. In the preferred embodiment, the number of iterations preferably is determined empirically as a trade-off between speed of optimization and quality of the final result. A typical number of iterations is 3, although more iterations might provide better results.

In step 92, the nets are re-created from the area-nets by eliminating the boundary pins in a manner similar to that described in step 84.

By dividing nets in the manner described above, the present invention an permit different pre-defined areas on a surface to be re-routed independently, regardless of the configurations of individual nets included in the initial routing. In addition, dividing nets in this manner will often significantly reduce the aggregate processing time required to re-route large nets, particularly when techniques such as maze-type techniques are utilized. In this regard, it will generally be faster to, process a number of small matrices than a single large matrix.

In addition, by utilizing different area configurations as described above, over a number of iterations the present invention typically will disperse routing away from overly congested areas. Accordingly, the present invention can permit re-routing using parallel processing on different pre-defined areas, while at the same time frequently permitting connections to be re-routed to different regions of the chip, largely unconstrained by the boundaries of the areas assigned to individual processors.

Finally, the present invention has been described above with respect to re-routing wire connections during integrated circuit design. However, it should be understood that the invention is also applicable to routing optimization for other types of initial wire routings, such as wire routing on a printed circuit board. Moreover, the invention is applicable not only to wire routing optimization, but to any other routing optimization problem as well. Thus, while the terms "cell", "net", "pin" and "netlist" have been described above in the context of integrated circuit design, unless otherwise expressly limited to that context, those terms should be understood in their most general sense. For instance, a "pin" might be any connection terminal, a "cell" might be any type of device or object that includes at least one connection terminal, a "net" might be any group of connected pins, and a "netlist" might be a list of any type of cells and nets.

Design System Environment

Figure 5:
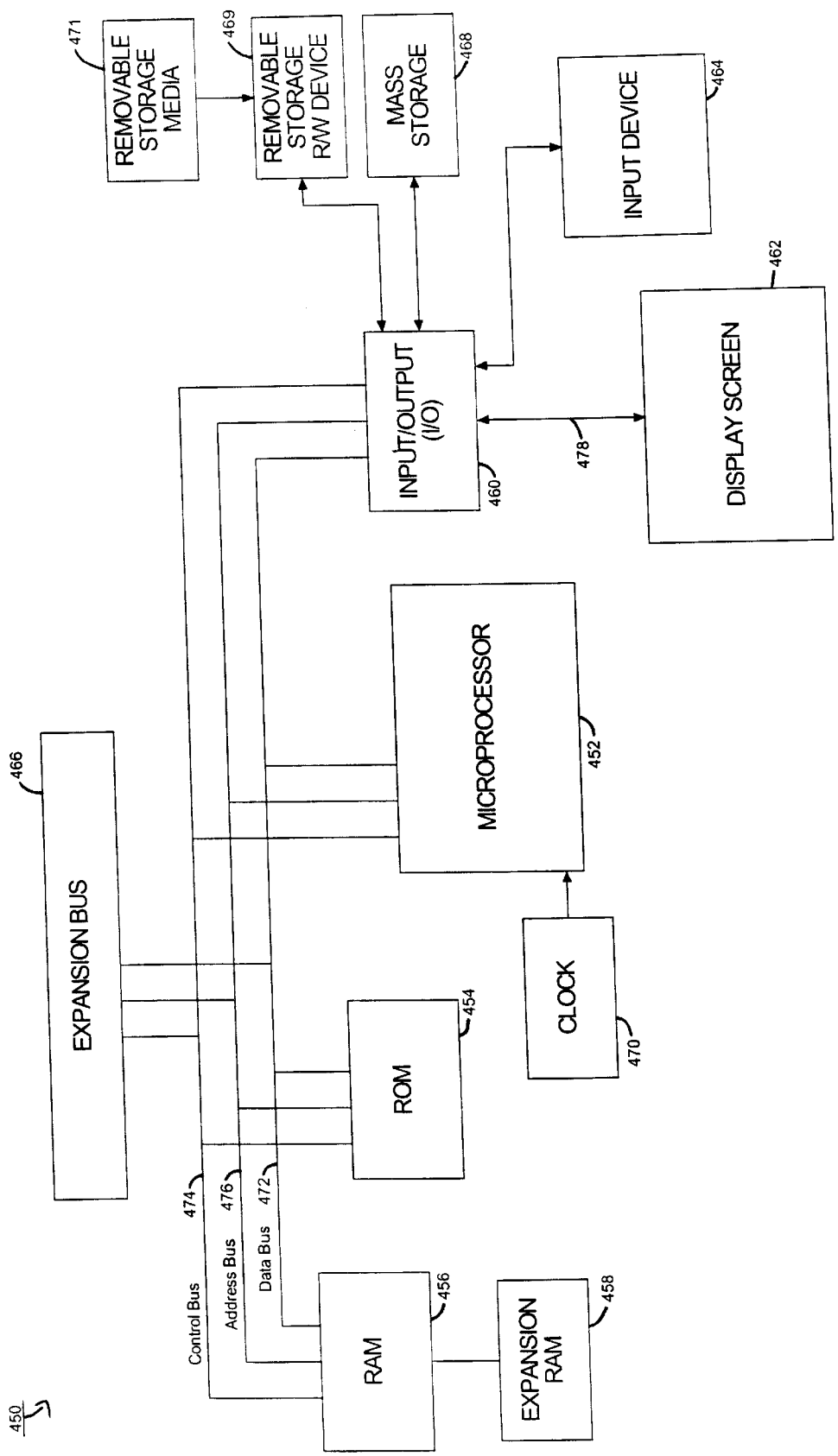
FIG. 5 is a block diagram of a general purpose computer system, representing one suitable computer platform for implementing the methods of the invention.

Generally, the methods described herein with respect to IC design will be practiced with a general purpose computer, either with a single processor or multiple processors. FIG. 5 is a block diagram of a general purpose computer system, representing one of many suitable computer platforms for implementing the methods described above. FIG. 5 shows a general purpose computer system 450 in accordance with the present invention. As shown in FIG. 5, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for optimizing an initial routing that connects nets on a surface, each of the nets including plural interconnected net pins, said method comprising:
   a dividing step of dividing the surface into a set of areas;
   a boundary pin defining step of defining a boundary pin at each point on a boundary of one of the areas where the boundary of the one of the areas intersects a net;
   a routing optimization step of independently performing a routing optimization in at least one of the areas, wherein the routing optimization optimizes the routing among the net pins and the boundary pins within said at least one of the areas;
   a shifting step of shifting the boundaries of the areas in order to obtain a second set of areas;
   a boundary pin eliminating step of eliminating the boundary pins defined in said boundary pin defining step;
   a second boundary pin defining step of defining a new boundary pin at each point on a boundary of one of the areas in the second set where the boundary of the one of the areas in the second set intersects a net; and
   a second routing optimization step of independently performing a second routing optimization in at least one of the areas in the second set, wherein the second routing optimization optimizes the routing among the net pins and the new boundary pins within said at least one of the areas in the second set,
   wherein each area in the set overlaps at least two areas in the second set, and wherein each area in the second set overlaps at least two areas in the set.

2. A method according to claim 1, wherein the surface is at least a portion of an integrated circuit die.

3. A method according to claim 2, wherein the initial routing is implemented on plural metal layers of the integrated circuit die.

4. A method according to claim 1, wherein each of the areas has a size of approximately twice an expected average net size in each of length and width.

5. A method according to claim 1, wherein the shifting step shifts each boundary of the areas by a same amount to obtain the second set of areas.

6. A method for optimizing an initial routing that connects nets on a surface, each of the nets including plural interconnected net pins, said method comprising:

a first dividing step of dividing the surface into a first set of pre-defined areas;
a first routing optimization step of performing routing optimization independently in each of the pre-defined areas in the first set;
a second dividing step of dividing the surface into a second set of pre-defined areas, wherein the second set of pre-defined areas is obtained by shifting boundaries of the pre-defined areas in the first set; and
a second routing optimization step of performing routing optimization independently in each of the pre-defined areas in the second set,
wherein each area in the first set overlaps at least two pre-defined areas in the second set, and wherein each area in the second set overlaps at least two pre-defined areas in the first set.

7. A method according to claim 6, wherein the surface is at least a portion of an integrated circuit die.

8. A method according to claim 7, wherein the initial routing is implemented on plural metal layers of the integrated circuit die.

9. A method according to claim 6, wherein the pre-defined areas in the first set are rectangular-shaped.

10. A method according to claim 6, wherein the second set of pre-defined areas is formed by shifting boundaries of the pre-defined areas in the first set in only a single dimension.

11. A method according to claim 10, wherein each area in the first set of pre-defined areas has a characteristic length in the single dimension, and wherein the first set of pre-defined areas is shifted approximately one-half of the characteristic length in the single dimension to obtain the second set of pre-defined areas.

12. A method according to claim 6, further comprising:
   a third dividing step of dividing the surface into a third set of pre-defined areas; and
   a third routing optimization step of performing routing optimization independently in each of the pre-defined areas in the third set.

13. A method according to claim 12, wherein each area in the second set overlaps at least two pre-defined areas in the third set, and wherein each area in the third set overlaps at least two pre-defined areas in the second set.

14. A method according to claim 13, wherein each area in the first set overlaps at least two pre-defined areas in the third set, and wherein each area in the third set overlaps at least two pre-defined areas in the first set.

15. A method according to claim 12, wherein the third set of pre-defined areas is obtained by shifting boundaries of the pre-defined areas in the second set.

16. A method according to claim 6, wherein the routing optimization performed on the pre-defined areas in the first set and the routing optimization performed on pre-defined areas in the second set are executed so as to re-route connections routed through congested areas.

17. A method according to claim 6, wherein the routing optimization performed on the pre-defined areas in the first set and the routing optimization performed on pre-defined areas in the second set are identical to each other and similar to the initial routing.

18. A method according to claim 6, further comprising a boundary pin defining step of defining a boundary pin at each point on a boundary of one of the pre-defined areas in the first set where the boundary of the one of the pre-defined areas in the first set intersects a net.

19. A method according to claim 6, wherein the second set of pre-defined areas is obtained by shifting each boundary of the pre-defined areas in the first set by a same amount.

20. A method for optimizing an initial routing that connects nets on a surface, each of the nets including plural interconnected net pins, said method comprising:
dividing the surface into a first set of pre-defined areas;
performing routing optimization independently in each of the pre-defined areas in the first set;
dividing the surface into a second set of pre-defined areas; and
performing routing optimization independently in each of the pre-defined areas in the second set,
wherein each of plural pre-defined areas in the first set overlaps at least two pre-defined areas in the second set, and wherein each of plural pre-defined areas in the second set overlaps at least two pre-defined areas in the first set.

21. A computer-readable medium storing computer-executable process steps for optimizing an initial routing that connects nets on a surface, each of the nets including plural interconnected net pins, said process steps comprising:
a dividing step to divide the surface into a set of areas;
a boundary pin defining step to define a boundary pin at each point on a boundary of one of the areas where the boundary of the one of the areas intersects a net;
a routing optimization step to independently perform a routing optimization in at least one of the areas, wherein the routing optimization optimizes the routing among the net pins and the boundary pins within said at least one of the areas;
a shifting step to shift the boundaries of the areas in order to obtain a second set of areas;
a boundary pin eliminating step to eliminate the boundary pins defined in said boundary pin defining step;
a second boundary pin defining step to define a new boundary pin at each point on a boundary of one of the areas in the second set where the boundary of the one of the areas in the second set intersects a net; and
a second routing optimization step to independently perform a second routing optimization in at least one of the areas in the second set, wherein the second routing optimization optimizes the routing among the net pins and the new boundary pins within said at least one of the areas in the second set,
wherein each area in the set overlaps at least two areas in the second set, and wherein each area in the second set overlaps at least two areas in the set.

22. A computer-readable medium according to claim 21, wherein the surface is at least a portion of an integrated circuit die.

23. A computer-readable medium according to claim 22, wherein the initial routing is implemented on plural metal layers of the integrated circuit die.

24. A computer-readable medium according to claim 21, wherein each of the areas has a size of approximately twice an expected average net size in each corresponding dimension.

25. A computer-readable medium according to claim 21, wherein the shifting step shifts each boundary of the areas by a same amount to obtain the second set of areas.

26. A computer-readable medium storing computer-executable process steps for optimizing an initial routing that connects nets on a surface, each of the nets including plural interconnected net pins, said process steps comprising:
a first dividing step to divide the surface into a first set of pre-defined areas;
a first routing optimization step to perform routing optimization independently in each of the pre-defined areas in the first set;
a second dividing step to divide the surface into a second set of pre-defined areas, wherein the second set of pre-defined areas is obtained by shifting boundaries of the pre-defined areas in the first set; and
a second routing optimization step to perform routing optimization independently in each of the pre-defined areas in the second set,
wherein each area in the first set overlaps at least two pre-defined areas in the second set, and wherein each area in the second set overlaps at least two pre-defined areas in the first set.

27. A computer-readable medium according to claim 26, wherein the surface is at least a portion of an integrated circuit die.

28. A computer-readable medium according to claim 26, wherein each area in the first set of pre-defined areas has a characteristic length in the single dimension, and wherein the first set of pre-defined areas is shifted approximately one-half of the characteristic length in the single dimension to obtain the second set of pre-defined areas.

29. A computer-readable medium according to claim 26, wherein said process steps further comprise:
a third dividing step to divide the surface into a third set of pre-defined areas; and
a third routing optimization step to perform routing optimization independently in each of the pre-defined areas in the third set.

30. A computer-readable medium according to claim 26, wherein said process steps further comprise a boundary pin defining step to define a boundary pin at each point on a boundary of one of the pre-defined areas in the first set where the boundary of the one of the pre-defined areas in the first set intersects a net.

31. A computer-readable medium according to claim 26, wherein the second set of pre-defined areas is obtained by shifting each boundary of the pre-defined areas in the first set by a same amount.

32. An apparatus for optimizing an initial routing that connects nets on a surface, each of the nets including plural interconnected net pins, said apparatus comprising:
a dividing means for dividing the surface into a set of areas;
a boundary pin defining means for defining a boundary pin at each point on a boundary of one of the areas where the boundary of the one of the areas intersects a net;
a routing optimization means for independently performing a routing optimization in at least one of the areas, wherein the routing optimization optimizes the routing among the net pins and the boundary pins within said at least one of the areas;
a shifting means for shifting the boundaries of the areas in order to obtain a second set of areas;
a boundary pin eliminating means for eliminating the boundary pins defined by said boundary pin defining means;
a second boundary pin defining means for defining a new boundary pin at each point on a boundary of one of the areas in the second set where the boundary of the one of the areas in the second set intersects a net; and a second routing optimization means for independently performing a second routing optimization in at least one of the areas in the second set, wherein the second routing optimization optimizes the routing among the net pins and the new boundary pins within said at least one of the areas in the second set, wherein each area in the set overlaps at least two areas in the second set, and wherein each area in the second set overlaps at least two areas in the set.

33. An apparatus for optimizing an initial routing that connects nets on a surface, each of the nets including plural interconnected net pins, said apparatus comprising:

a first dividing means for dividing the surface into a first set of pre-defined areas;

a first routing optimization means for performing routing optimization independently in each of the pre-defined areas in the first set;

a second dividing. means for dividing the surface into a second set of pre-defined areas, wherein the second set of pre-defined areas is obtained by shifting boundaries of the pre-defined areas in the first set; and a second routing optimization means for performing routing optimization independently in each of the pre-defined areas in the second set, wherein each area in the first set overlaps at least two pre-defined areas in the second set, and wherein each area in the second set overlaps at least two pre-defined areas in the first set.

* * * * *